(12) United States Patent
Tomioka et al.

(10) Patent No.: US 7,115,522 B2
(45) Date of Patent: Oct. 3, 2006

(54) METHOD FOR MANUFACTURING SEMICONDUCTOR DEVICE

(75) Inventors: Kazuhiro Tomioka, Yokohama (JP); Haoren Zhuang, Hopewell Junction, NY (US)

(73) Assignees: Kabushiki Kaisha Toshiba, Tokyo (JP); Infineon Technologies AG, Munich (DE)

( * ) Notice: Subject to any disclaimer, the term of this patent is extended or adjusted under 35 U.S.C. 154(b) by 146 days.

(21) Appl. No.: 10/886,668

(22) Filed: Jul. 9, 2004

(65) Prior Publication Data

US 2006/0009040 A1    Jan. 12, 2006

(51) Int. Cl.
*H01I 21/302* (2006.01)
(52) U.S. Cl. .............. 438/714; 438/253; 438/706; 134/1.1
(58) Field of Classification Search ........ 438/706, 438/710, 712, 720, 253, 256, 714; 134/1.1
See application file for complete search history.

(56) References Cited

U.S. PATENT DOCUMENTS 6,573,111 B1 * 6/2003 Nagano et al. ............. 438/3

2002/0037647 A1 * 3/2002 Hwang et al. ............. 438/689
2003/0100151 A1 * 5/2003 Okamoto ................... 438/163
2004/0115928 A1 * 6/2004 Malhotra et al. .......... 438/639

FOREIGN PATENT DOCUMENTS

JP    2002-537645    11/2002

* cited by examiner

*Primary Examiner*—Lan Vinh
(74) *Attorney, Agent, or Firm*—Oblon, Spivak, McClelland, Maier & Neustadt, P.C.

(57) ABSTRACT

A method for manufacturing a semiconductor device including a substrate to be processed having a conductive layer essentially consisting of platinum includes etching the conductive layer, and generating plasma and cleaning the substrate, to which an etching product adhere, by means of ions in the plasma. The cleaning includes heating the substrate to a first temperature, introducing gas, which contains chlorine and nitrogen and in which a ratio of chlorine atoms to nitrogen atoms is 9:1 to 5:5, and applying high-frequency power to an electrode, on which the substrate is placed.

18 Claims, 2 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device including a platinum layer, and particularly to a method for cleaning the semiconductor device using plasma.

2. Description of the Related Art

In recent years, platinum (Pt) has been used in many semiconductor devices as a material of electrodes in a DRAM (Dynamic Random Access Memory) or FeRAM (Ferroelectric Random Access Memory). As the integration density of the DRAM or FeRAM has become higher, the demand for finely etching the platinum layer has increased.

A thin film made of material having a low vapor pressure, such as platinum, is generally etched by physical etching in the following manner. First, plasma is generated in a process chamber, for example. Then, bias power is applied to an electrode on which a substrate to be processed is placed, so that an electric field is generated in the plasma. The electric field attracts ions in the plasma to the surface of the substrate, thereby etching the substrate.

However, in the physical etching generally employed to etch a thin film made of material having a low vapor pressure, such as platinum, the etching product is not volatilized. Therefore, minute platinum particles having a diameter of several nanometers adhere to the surface of the substrate to be processed. The adhesion of the platinum etching product to the surface of the substrate deteriorates the electrical characteristics of the semiconductor device including the substrate.

In connection with this matter, a technique for carrying out etching without adhesion of the platinum etching product has been disclosed (PCT National Publication No. 2002-537645).

BRIEF SUMMARY OF THE INVENTION

According to a first aspect of the present invention, there is provided a method for manufacturing a semiconductor device including a substrate to be processed having a conductive layer essentially consisting of platinum, the method comprising: etching the conductive layer; and generating plasma and cleaning the substrate, to which an etching product adhere, by means of ions in the plasma, wherein the cleaning includes: heating the substrate to a first temperature; introducing gas, which contains chlorine and nitrogen and in which a ratio of chlorine atoms to nitrogen atoms is 9:1 to 5:5; and applying high-frequency power to an electrode, on which the substrate is placed.

According to a second aspect of the present invention, there is provided a method for manufacturing a semiconductor device including a substrate to be processed having a conductive layer essentially consisting of platinum, the method comprising: etching the conductive layer; and generating plasma and cleaning the substrate, to which an etching product adhere, by means of ions in the plasma, wherein the cleaning includes: heating the substrate to a first temperature; introducing third gas, which contains first gas containing chlorine and second gas containing nitrogen and in which a ratio in volume of the first gas to the second gas is 9:1 to 5:5; and applying high-frequency power to an electrode, on which the substrate is placed.

DETAILED DESCRIPTION OF THE INVENTION

An embodiment of the present invention will be described with reference to the accompanying drawings. In the following descriptions, elements having the same function and the same structure are represented by the same reference symbol, and the explanation of the elements is repeated only when necessary.

Figure 1:
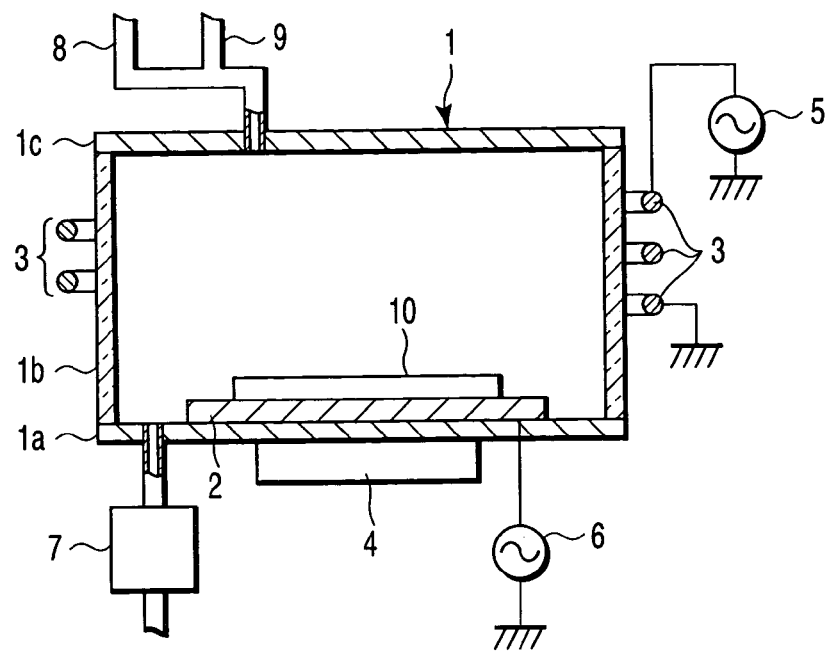
FIG. 1 is a schematic sectional view showing the structure of a cleaning apparatus according to a first embodiment of the present invention.

FIG. 1 is a schematic sectional view showing the structure of a cleaning apparatus according to a first embodiment of the present invention. The cleaning apparatus includes a chamber 1, an electrode 2, a coil 3, a heater 4, a high-frequency power source 5, a bias power source 6, an exhaust pump 7, a chlorine gas introducing portion 8 and a nitrogen gas introducing portion 9.

The chamber 1 comprises a bottom plate 1a made of metal, a cylindrical side plate 1b made of quartz and a top plate 1c made of metal. The inside of the chamber 1 is kept vacuum. The heater 4 is placed on the outer surface of the bottom plate 1a of the chamber 1. The heater 4 heats the electrode 2 (more specifically, a wafer 10) to a predetermined temperature. The electrode 2 is placed on the inner surface of the bottom plate of the chamber 1.

The electrode 2 is connected to the bias power source 6. The bias power source 6 supplies bias power having a frequency of, for example, 13.56 MHz, to the electrode 2. The wafer 10, a substrate to be processed, is placed on the electrode 2. The electrode 2, on which the wafer 10 is placed, plays a role of controlling the energy when ions in plasma are incident on the wafer 10.

The coil 3 is wound around the chamber 1. One end of the coil 3 is grounded. The other end of the coil 3 is connected to the high-frequency power source 5. The high-frequency power source 5 supplies high-frequency power having a frequency of, for example, 1.8 MHz, to the coil 3. The high-frequency power causes plasma to generate in the chamber 1. The above frequency of the bias power or the high-frequency power is only an example, and an arbitrary frequency may be set as far as the power source can supply a predetermined power.

An exhaust hole is provided in the bottom plate of the chamber 1. The exhaust pump 7 is connected to the exhaust hole. The exhaust pump 7 exhausts the gas from the chamber 1. A gas introduction hole is provided in the top plate of the chamber 1. The chlorine gas introducing portion 8 and the nitrogen gas introducing portion 9 are connected to the gas introduction hole. Chlorine gas is introduced into the chamber 1 through the chlorine gas introducing portion 8. Nitrogen gas is introduced into the chamber 1 through the nitrogen gas introducing portion 9. The pressure in the chamber 1 is set to a constant value in accordance with the displacement of the exhaust pump 7 and the flow rates of the introduced chlorine gas and nitrogen gas.

Figure 2:
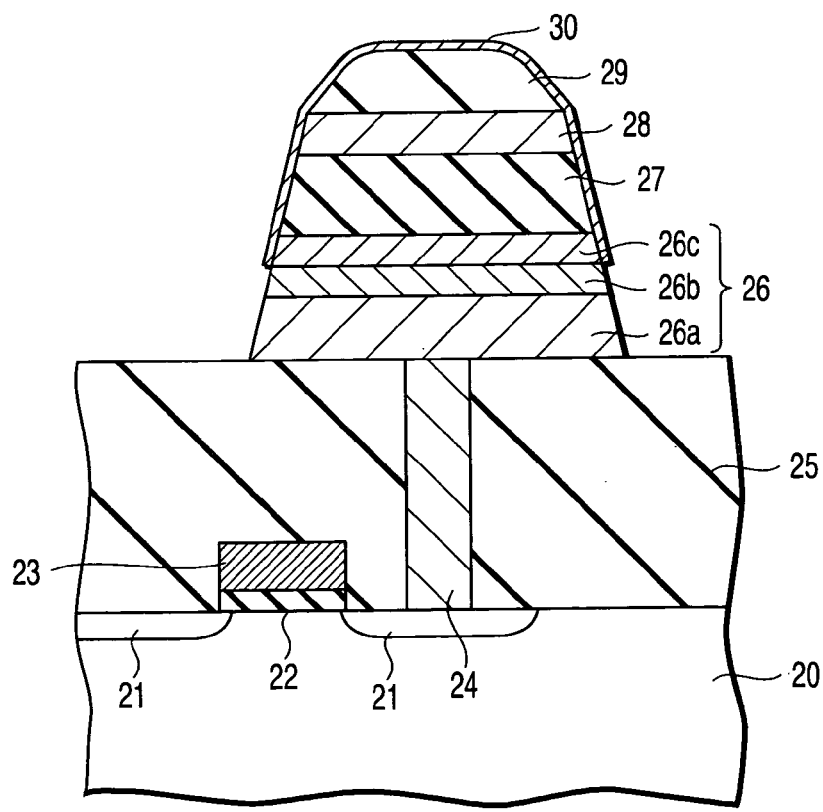
FIG. 2 is a sectional view showing an example of a wafer 10 shown in FIG. 1.

The wafer 10 includes a platinum layer. A mask layer (for example, $SiO_2$ layer) may be provided on the platinum layer. An etching product (platinum particles), which is produced when the platinum layer is etched, adhere to the platinum layer or the mask layer. FIG. 2 is a sectional view showing an example of the wafer 10. The wafer 10 comprises, for example, an FeRAM.

A gate insulating film 22 is formed on a silicon substrate 20, and a gate electrode 23 is formed on the gate insulating film 22. Source and drain regions 21 are formed on both sides of the gate insulating film 22 in the silicon substrate. A switching transistor (comprising the source and drain regions 21, the gate insulating film 22 and the gate electrode 23) is coated with an interlayer insulating film 25. The interlayer insulating film 25 is formed of, for example, $SiO_2$.

A contact plug 24, extending through the interlayer insulating film 25, is formed on one of the source and drain region 21, i.e., one of the terminals of the switching transistor. The contact plug 24 is formed of, for example, tungsten. The contact plug 24 is connected to a ferroelectric capacitor.

The ferroelectric capacitor comprises a lower electrode 26, a ferroelectric film 27 and an upper electrode 28. The lower electrode 26 comprises an iridium layer 26a, an iridium oxide layer 26b and a platinum layer 26c, which are laminated in this order. The ferroelectric film 27 is formed on the lower electrode 26. The ferroelectric film 27 is formed of, for example, PZT ($PbZr_xTi_{1-x}O_3$). The upper electrode 28 is formed on the ferroelectric film 27. The upper electrode 28 is formed of platinum.

When the wafer 10 of the above structure is to be formed, it is necessary to etch the upper electrode 28 made of platinum into a desired shape. This etching step is performed by using, for example, RIE (Reactive Ion Etching).

More-specifically, a mask layer 29 is formed on the upper electrode 28. The mask layer 29 is formed of, for example, $SiO_2$. The wafer 10 is placed on the electrode, to which high-frequency power can be applied. Then, chlorine gas is introduced in the plasma process chamber, so that plasma is generated in the plasma process chamber. The generation of the plasma causes dissociation of the chloride gas in the plasma, resulting in generation of adsorptive neutral particles, and ions or the like, which facilitate the etching reaction. The neutral particles and ions are incident on the wafer 10, so that the desired etching on the wafer 10 is realized.

When the platinum is etched in the method described above, minute platinum particles 30 as an etching product adhere to the mask layer 29, the side surfaces of the ferroelectric capacitor, the interlayer insulating film 25, etc (platinum particles on the interlayer insulating film 25 are not shown). The wafer 10 is not limited to the FeRAM but may be any substrate having a platinum layer.

A method for cleaning the platinum particles 30 will be described. First, the wafer 10 to which the platinum particles 30 adhere is placed on the electrode 2. Then, the electrode 2 is heated by the heater 4 to, for example, 350° C. At this time, the wafer 10 on the electrode 2 is also heated to about 350° C.

Thereafter, chloride gas and nitrogen gas are introduced in the chamber 1. The flow rate of the mixture gas of chloride gas and nitrogen gas is set to, for example, 200 SCCM. The pressure in the chamber 1 is kept at, for example, 2 Pa. The pressure is set by means of the exhaust pump 7 as described before.

Then, the power of the high-frequency power source 5 is set to 1000 W. The power per unit area (the value obtained by dividing the applied power by the area of the electrode 2) of the bias power source 6 is set to 0.02 $W/cm^2$. As a result, plasma is generated in the chamber 1, and ions in the plasma are incident on the wafer 10.

Figure 3:
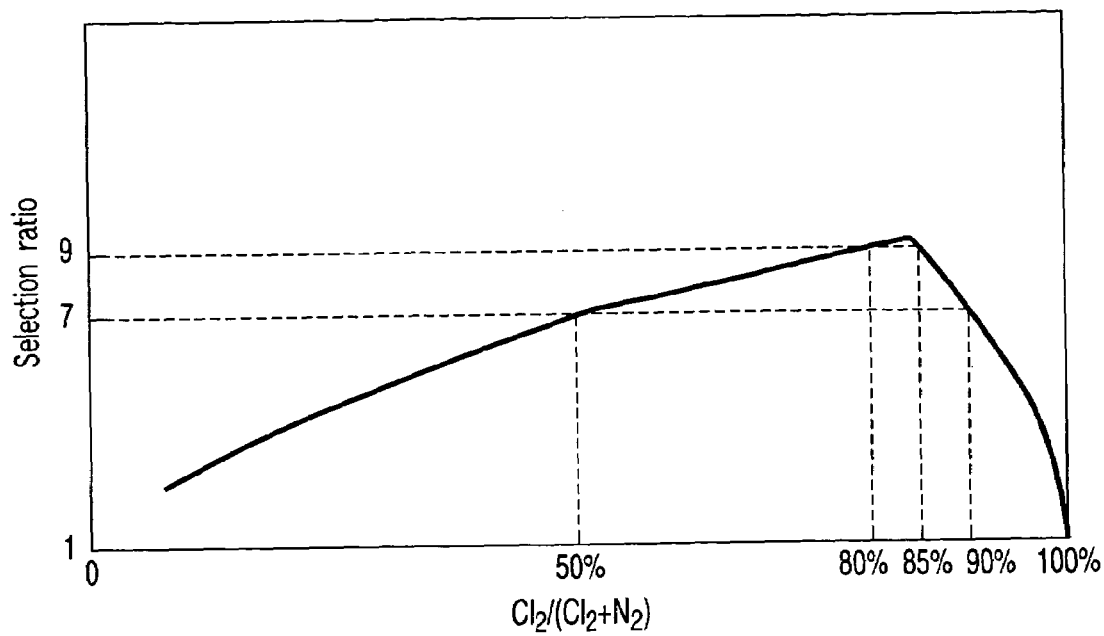
FIG. 3 is a diagram showing the relationship between introduced gas and a selection ratio.

FIG. 3 is a diagram showing the relationship between introduced gas and a selection ratio. The vertical axis represents the ratio in etching speed (selection ratio) of platinum to $SiO_2$. The horizontal axis represents the ratio in volume of chlorine gas to mixture gas of chlorine gas and nitrogen gas, i.e., $Cl_2/(Cl_2+N_2)$. The relationship shown in FIG. 3 also holds in the case where the ratio of chlorine atoms to chlorine and nitrogen atoms are taken as the horizontal axis.

The value of the selection ratio was measured, while the ratio of chlorine gas to nitrogen gas was varied. As shown in FIG. 3, it is clear that the selection ratio is 7 or more, when the ratio in volume of chlorine gas to nitrogen gas is in the range 5:5 to 9:1. When the wafer 10 to which the platinum particles 30 adhered was subjected to cleaning with the mixture gas in this range for one minute, the minute platinum particles 30 adhered to the mask layer 29 made of $SiO_2$ were removed. The platinum particles 30 adhered to the side surface of the ferroelectric capacitor (more specifically, the side surfaces of the upper electrode 28 comprising the platinum layer and the ferroelectric film 27) were also removed. Further, the platinum particles 30 adhered to the surface of a portion of the substrate that does not include a platinum layer (the interlayer insulating film 25 in FIG. 2) were removed. In this time, neither the mask layer 29 nor the upper electrode 28 was etched or reduced in thickness.

When the selection ratio was less than 7, sometimes $SiO_2$ as the mask layer 29 was etched or the shape of the ferroelectric capacitor was changed. Therefore, it is preferable that the selection ratio be 7 or more in this embodiment.

The requirement of the selection ratio 7 is applied to only the relationship between platinum and $SiO_2$. The requirement of the selection ratio naturally changes depending on the material of the mask layer. For example, the mask layer may be formed of SiN, alumina, titanium oxide, or the like. When any of these materials was used as the mask layer, the relationship similar to that shown in FIG. 3 held. As far as the ratio of chlorine gas to nitrogen gas was 5:5 to 9:1, a high selection ratio was obtained in the cleaning process. For example, when SiN was used as the mask layer, the selection ratio was higher than in the case of $SiO_2$ mask layer.

Further, as shown in FIG. 3, in the case where the ratio in volume of chlorine gas to nitrogen gas was 8:2 to 8.5:1.5, a higher selection ratio (9 or higher) was obtained in the cleaning process. In this range of the selection ratio, the cleaning process with higher accuracy can be performed. Even if the cleaning process time is prolonged, neither the mask layer 29 nor the upper electrode 28 will be etched or reduced in thickness.

Figure 4:
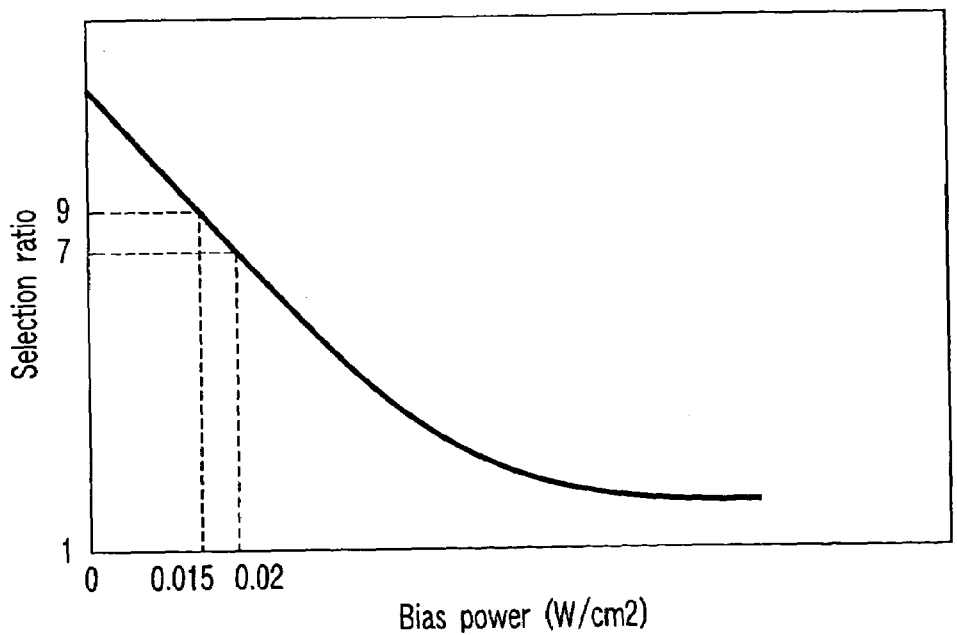
FIG. 4 is a diagram showing the relationship between bias power and a selection ratio in the case where the ratio of chlorine gas to nitrogen gas is 5:5.

The relationship between bias power supplied to the electrode 2 and the selection ratio of platinum to $SiO_2$ will now be described. FIG. 4 is a diagram showing the relationship between bias power and a selection ratio in the case where the ratio in volume of chlorine gas to nitrogen gas is 5:5. All conditions except for the bias power supplied from the bias power source 6 are the same as those described above.

The bias power supplied to the electrode 2 controls the energy of ions in the plasma generated in the chamber 1.

More specifically, the energy of the ions is raised by increasing the bias power, and lowered by decreasing the bias power.

The selection ratio corresponding to the bias power was measured while the bias power was varied. As shown in FIG. 4, the selection ratio was 7 or more when the bias power supplied from the bias power source 6 was 0.02 W/cm$^2$ or lower. While the bias power of this range was supplied, the wafer 10 was subjected to cleaning for removing platinum particles adhered thereto for one minute. In this case, the minute platinum particles 30 adhered to the mask layer 29 made of SiO$_2$ were removed. The platinum particles 30 adhered to the side surface of the ferroelectric capacitor were also removed. Further, the platinum particles 30 adhered to the surface of a portion of the substrate that does not include a platinum layer were removed. In this time, neither the mask layer 29 nor the upper electrode 28 was etched or reduced in thickness.

As shown in FIG. 4, when the bias power was 0.015 W/cm$^2$ or lower, a higher selection ratio (9 or higher) was obtained. When the bias power in this range is supplied, the cleaning process with higher accuracy can be performed. Even if the cleaning process time is prolonged, neither the mask layer 29 nor the upper electrode 28 will be etched or reduced in thickness.

In this embodiment, the wafer 10 is heated to 350° C. However, the above effect can be obtained if the temperature is at least 300° C, although it is preferable to heat the wafer above 350° C. The selection ratio can be 7 or higher as far as the ratio of chlorine gas to nitrogen gas was 5:5 to 9:1.

The gas used in this embodiment is not limited to chlorine gas or nitrogen gas. The platinum particles 30 can be cleaned in the same manner as described above by using any chlorine-containing gas or nitrogen-containing gas. The chlorine-containing gas may be Cl$_2$, HCl, ClF$_3$, CCl$_4$, BCl$_3$ or the like. The nitrogen-containing gas may be N$_2$, NH$_3$, NO, NO$_2$, NF$_3$ or the like.

Cleaning of the platinum particles 30 was performed by using one selected from the group consisting of the above chlorine-containing gases and one selected from the group consisting of the above nitrogen-containing gases. All conditions of the measurement except for the kinds of introduced gas are the same as those in the measurement shown in FIG. 3.

In this case, as far as the ratio in volume of one selected from the group consisting of the chlorine-containing gases to one selected from the group consisting of the nitrogen-containing gases was 5:5 to 9:1, the relationship as shown in FIG. 3 held. More specifically, a high selection ratio required for cleaning of the platinum particles was obtained, so that the minute platinum particles 30 adhered to the mask layer 29 made of SiO$_2$ were removed. In addition, the platinum particles 30 adhered to the side surface of the ferroelectric capacitor were removed. In this time, neither the mask layer 29 nor the upper electrode 28 was etched or reduced in thickness.

In the case where the ratio of chlorine-containing gas to nitrogen-containing gas was 8:2 to 8.5:1.5, a higher selection ratio was obtained in the cleaning process. In this range of the selection ratio, the cleaning process with higher accuracy can be performed. Moreover, even if the cleaning process time is prolonged, neither the mask layer 29 nor the upper electrode 28 will be etched or reduced in thickness.

If the ratio in volume of chlorine-containing gas to nitrogen-containing gas is 5:5, when the bias power supplied from the bias power source 6 was 0.02 or lower, a high selection ratio required for cleaning was also obtained.

Further, when the bias power was 0.015 W/cm$^2$ or lower, a higher selection ratio was obtained. When the bias power in this range is supplied, the cleaning process with higher accuracy can be performed.

The temperature of heating the wafer 10 is also the same as described above. In this embodiment, the wafer 10 is heated to 350° C. However, a high selection ratio required for cleaning the platinum particles 30 can be obtained if the temperature is at least 300° C. It is preferable to heat the wafer above 350° C., in which case the selection ratio can be further increased.

As described above, according to this embodiment, in the process of cleaning the wafer 10 having a platinum layer by generating plasma, chlorine gas and nitrogen gas are introduced in the cleaning chamber with the ratio of the chlorine atoms to the nitrogen atoms being 5:5 to 9:1. Further, the bias power supplied to the electrode 2, on which the wafer 10 is placed, is set to 0.02 W/cm$^2$ or lower. Furthermore, the wafer 10 is heated to a temperature of 300° C. or higher.

Therefore, the above embodiment allows removal of the platinum particles adhered to a semiconductor device or the like in a step of etching a platinum layer of the device. The removal of the platinum particles produces the following effects.

First, since platinum is electrically conductive, it may cause a short. Therefore, if the platinum particles 30 adhere to a semiconductor device, the electrical characteristics will deteriorate. However, in the embodiment described above, since the platinum particles can be removed, the electrical characteristics cannot deteriorate.

Secondly, when an interlayer insulating film is formed on, for example, a ferroelectric capacitor, hydrogen is generated from gas used for depositing the interlayer insulating film. Hydrogen damages the ferroelectric capacitor. Since platinum has a catalytic effect on hydrogen, it facilitates generation of hydrogen. As a result, the ferroelectric capacitor is further damaged. However, according to the above embodiment of the present invention, since the platinum particles 30 can be removed, generation of hydrogen can be suppressed. Therefore, the damage of the ferroelectric capacitor can be suppressed.

Thirdly, platinum may generate hydrogen from moisture, in which case the hydrogen will increase the damage of the ferroelectric capacitor. However, according to the above embodiment, since the platinum particles 30 can be removed, the generation of hydrogen can be suppressed. Therefore, the damage of the ferroelectric capacitor can be suppressed.

Fourthly, if a mask layer (made of, for example, SiO$_2$) is formed on the platinum layer, the selection ratio can be higher. Therefore, the platinum particles adhered to the mask layer can be removed. Consequently, the same effects as described above can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device including a substrate to be processed having a conductive layer essentially consisting of platinum, the method comprising:

etching the conductive layer; and generating plasma and cleaning the substrate, to which an etching product adhere, by means of ions in the plasma, wherein said cleaning includes:

heating the substrate to a first temperature;

introducing gas, which contains chlorine and nitrogen and in which a ratio of chlorine atoms to nitrogen atoms is 5:5 to 9:1; and applying high-frequency power to an electrode, on which the substrate is placed, the high-frequency power relative to a unit area of the electrode being at most 0.02 W/cm$^2$.

2. The method for manufacturing a semiconductor device according to claim 1, wherein the high-frequency power is at most 0.015 W/cm$^2$.

3. The method for manufacturing a semiconductor device according to claim 1, wherein the first temperature is at least 300° C.

4. The method for manufacturing a semiconductor device according to claim 1, wherein the substrate includes a mask layer provided on the conductive layer and platinum particles adhered to the mask layer, and the etching product corresponds to the platinum particles.

5. The method for manufacturing a semiconductor device according to claim 1, wherein the substrate includes a capacitor having a lower electrode, a ferroelectric layer and an upper electrode, and the conductive layer corresponds to the upper electrode.

6. A method for manufacturing a semiconductor device including a substrate to be processed having a conductive layer essentially consisting of platinum, the method comprising:

etching the conductive layer; and generating plasma and cleaning the substrate, to which an etching product adhere, by means of ions in the plasma, wherein said cleaning includes:

heating the substrate to a first temperature;

introducing third gas, which contains first gas containing chlorine and second gas containing nitrogen and in which a ratio in volume of the first gas to the second gas is 5:5 to 9:1; and applying high-frequency power to an electrode, on which the substrate is placed, the high-frequency power relative to a unit area of the electrode being at most 0.02 W/cm$^2$.

7. The method for manufacturing a semiconductor device according to claim 6, wherein the first gas is one selected from the group consisting of HCl, ClF$_3$, CCl$_4$ and BCl$_3$.

8. The method for manufacturing a semiconductor device according to claim 6, wherein the second gas is one selected from the group consisting of NH$_3$, NO, NO$_2$ and NF$_3$.

9. The method for manufacturing a semiconductor device according to claim 6, wherein the high-frequency power is at most 0.015 W/cm$^2$.

10. The method for manufacturing a semiconductor device according to claim 6, wherein the first temperature is at least 300° C.

11. The method for manufacturing a semiconductor device according to claim 6, wherein the substrate includes a mask layer provided on the conductive layer and platinum particles adhered to the mask layer, and the etching product corresponds to the platinum particles.

12. The method for manufacturing a semiconductor device according to claim 6, wherein the substrate includes a capacitor having a lower electrode, a ferroelectric layer and an upper electrode, and the conductive layer corresponds to the upper electrode.

13. The method for manufacturing a semiconductor device according to claim 1, wherein the ratio of the chlorine atoms to the nitrogen atoms is 8:2 to 8.5:1.5.

14. The method for manufacturing a semiconductor device according to claim 1, wherein the first temperature is at least 350° C.

15. The method for manufacturing a semiconductor device according to claim 4, wherein the mask layer is formed of SiO$_2$.

16. The method for manufacturing a semiconductor device according to claim 6, wherein the ratio in volume of the first gas to the second gas is 8:2 to 8.5:1.5.

17. The method for manufacturing a semiconductor device according to claim 6, wherein the first temperature is at least 350° C.

18. The method for manufacturing a semiconductor device according to claim 11, wherein the mask layer is formed of SiO$_2$.

* * * * *